(12) United States Patent
Cooke

(10) Patent No.: US 6,348,802 B1
(45) Date of Patent: Feb. 19, 2002

(54) DEVICE FOR ENHANCING CONTACT CHECKING

(75) Inventor: Peter A. Cooke, Escondido, CA (US)

(73) Assignee: Electro Scientific Industries, Inc., Portland, OR (US)

( * ) Notice: Subject to any disclaimer, the term of this patent is extended or adjusted under 35 U.S.C. 154(b) by 0 days.

(21) Appl. No.: 09/290,474

(22) Filed: Apr. 12, 1999

Related U.S. Application Data

(60) Provisional application No. 60/081,524, filed on Apr. 10, 1998.

(51) Int. Cl.$^7$ ................................................ G01R 27/02
(52) U.S. Cl. ...................................................... 324/611
(58) Field of Search ................................ 324/611, 548, 324/551, 676, 678

(56) References Cited

U.S. PATENT DOCUMENTS 5,786,698 A * 7/1998 Mallory ...................... 324/611

* cited by examiner

Primary Examiner—Safet Metjahic
Assistant Examiner—J Kerveros
(74) Attorney, Agent, or Firm—John J. Murphey

(57) ABSTRACT

A device for increasing the sensitivity of a testing instrument in determining the presence of an electronic component, such as a miniature ceramic chip capacitor, at the test station before beginning the test procedure, including a signal booster having an input and an output in operable arrangement for boosting an incoming alternating signal from the testing device by a multiple greater than one, connecting the input of the signal booster between the signal output of the testing device and the station for positioning the component for measuring, and connecting the output of the signal booster between an independent direct current power supply and the test station to boost the signal of the presence testing program by a multiple that brings the measurable signal of the component within the range of sensitivity of the testing instrument.

12 Claims, 1 Drawing Sheet

DEVICE FOR ENHANCING CONTACT CHECKING

This application claim benefit to provisional 60/081,524 filed Apr. 10, 1998.

BACKGROUND OF THE INVENTION

1. Field of the Invention

This invention relates to the field of miniature electrical component measuring and testing. More particularly, it relates to a device to enhance the performance of high resistance electrical measuring instruments, such as the Hewlett Packard 4349B, and to a method of using that device to increase the sensitivity of such instruments in the "Parts Present" field below the minimum limits of their existing ranges.

2. Description of the Prior Art

In the field of miniature ceramic electrical capacitor chips, that may measure as small as 0.020×0.020×0.040 inches in external dimensions and exhibit a capacitance below one picofarad, it is well-known there is present a finite parallel conductance that results in some DC leakage current through the part. As capacitor chips are essential to the operation of computer and many other electronic instruments, it is essential to measure this DC (direct current) leakage current and to classify these chips accordingly. In the prior art, high resistance measuring instruments such as the Hewlett Packard Model 4349B are used.

In the ceramic capacitor (chip) industry, Hewlett Packard 4349B meters have been coupled to high speed component "handlers" or processing machines to measure the DC leakage current through these capacitors at high throughput rates. The handlers receive untested capacitor chips, which, either individually or in multiples, bring them to test stations at which the handlers connect the capacitor terminals to test instruments, (such as a current limited power supply on one side and the HP 4349B or other such high resistance/low current measuring device on the other), for DC leakage testing. Prior to or after leakage testing, the measuring instrument conducts a test protocol, "Part Present" or "Contact Check", to verify the presence of a capacitor at the test station which is satisfactorily connected on both sides to the test circuit. The reason for this protocol is to assure that the part at the test station is satisfactorily connected into the test circuit, because otherwise a part with high leakage characteristics could be classified as a "good" part when in fact it is not!

In the case of the BP 4349B, a triax cable connects the instrument to the LO side of the D.U.T. (device Under Test); the inner conductor of this cable carries the DC current signal from the D.U.T.; the inner shield carries an HF (high frequency) guard signal of approximately 0.5 MHz (Mega Hertz) generated within the 4349B at the time of the "Parts Present" test and the outer shield of the triax is grounded.

Now, the HI side of the D.U.T., which connects directly to the power supply, is, at high frequencies, essentially grounded. During the "Parts Present" test the HF signal that drives the guard is applied by the 4349B at the same amplitude to the inner conductor of the triax cable. In the absence of a satisfactory connection to a present or absent ceramic capacitor, the HF current flowing through the guard (the outer end of which is open) will therefore equal that flowing through the inner conductor and no part will be detected. In the event of a satisfactory connection at the test station to a present part, however, these currents will be unequal and a part present with satisfactory connection will be recognized by the 4349B. In the event that a "NO PART PRESENT" classification is made, this classification demands a retest of any part that may have been present in the test station and takes priority over any classification that is derived from the leakage current test.

The failing of this prior art practice is that parts with a capacitance value of less than 2pF often go undetected, even though a satisfactory contact is made thereto at the test station.

SUMMARY OF THE INVENTION

This invention is a device and method of using that device which permits the HP4349B to determine whether a part is present at the test station and a good contact made thereto, even when that part has a capacitance value as low as 0.75 pF. With respect to the device, it comprises a "signal booster" which may be a transformer, amplifier or other equivalent component with a differential input driven from the inner guard shield and outer ground shield of the HP4349B input triax cable. The output of this component is coupled in series with the output from the high voltage limited power supply and of such phase that it adds to the HF guard voltage across the D.U.T., that is derived directly from the 4349B, thereby increasing the amplitude of this signal and the sensitivity of the "part present" detection circuit within the HP-4349B, without internal modification of this proprietary instrument in any way.

More, specifically, one aspect of this invention is a capability to increase the minimum sensitivity of the secondary or tertiary test of test instruments whose primary function is the testing of electronic components for their prime parameters, (resistors, capacitors or inductors), when that secondary or tertiary test is the detection of the presence of such a component within a test station and is performed by a superimposed high frequency signal passed through the device-under-test. By "satisfactory connections" is meant as being of such a low ohmic value as not to degrade the accuracy of the primary test or of any other function of the instrument.

Accordingly, the main object of this invention is a means of determining the presence of a DUT at the test station before the high resistance leakage test is commenced. Other objects of the invention include a device and method of using it to verify that the test circuit, for performing an electrical leakage test, is closed on a ceramic chip capacitor so that whatever value is recorded, it will be the value of the capacitor in the test station; a means of reducing the time taken in commencing and then terminating an electronic test for electrical leakage so as to increase the availability of the test machine for other capacitors; a means of increasing the throughput of ceramic chip capacitors in component handlers to reduce the operation time and, hence, the cost of producing quality ceramic chip capacitors; a means of lowering the cost of ceramic chip capacitors by increasing the efficiency of capacitor test machines; and, a means of reducing capital expenditures for test equipment by increasing the capability of ceramic capacitor testing machines to test for the presence of capacitors having a capacitance of 2.0 pF or less.

These and other objects of the invention may be determined by reading the description of the preferred embodiment along with the drawings attached hereto. The scope of protection sought by the inventor may be gleaned from a fair reading of the claims that conclude this specification.

DESCRIPTION OF THE PREFERRED EMBODIMENT

Figure 1:
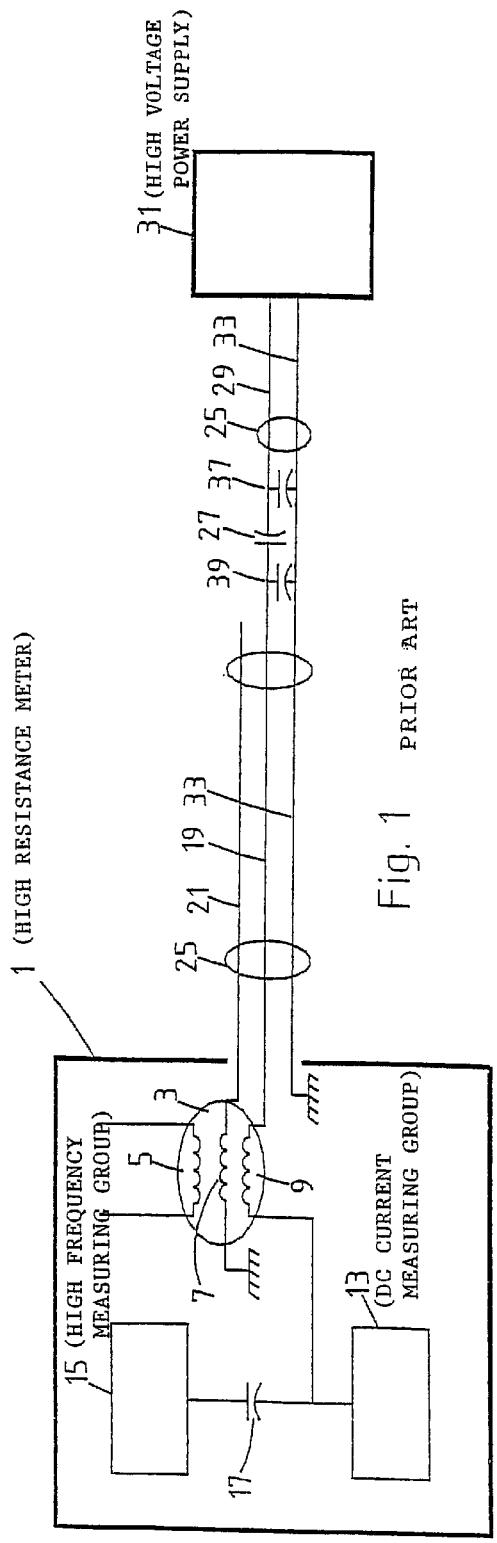
FIG. 1 is a schematic diagram of a prior art "contact check" or "part present" circuit using a Hewlett-Packard (HP) 4349B testing machine; and, FIG. 2 is a schematic diagram of the preferred embodiment of this invention modifying the same circuit as shown in FIG. 1.

Turning now to the drawings where elements and components are identified with numerals and like elements and components are identified with like numerals throughout the two figures, FIG. 1 shows a typical test system for determining the leakage value of ceramic chip capacitor Although the invention is shown or ceramic chip capacitors , those skilled in the art will appreciate that this invention may be used in other situations where it is necessary to electronically check the presence of a DUT (Device Under Test) and satisfactory electrical contact thereto.

With respect to the HP4349B, it has four identical input channels for leakage measurement, but for purposes of clarity, only one channel is illustrated and described. It will be appreciated that the invention adapted equally to all four channels.

Referring to FIG. 1, an HP-4349B High Resistance Meter 1 is shown to contain a toroid transformer 3 with three windings 5, 7 and 9, a DC current measuring group 13 and a high frequency measuring group 15, the input to which is coupled to the input circuit of the HP-4349B via a blocking capacitor 17. Not shown is a high frequency generator that, during the "parts present" test, drives transformer 3 via primary winding 5. There is also coupling of this signal to high frequency measuring group 15 for purposes of phase demodulation.

Secondary windings 7 and 9 are comprised of a few turns of coaxial cable and are thereby assured of exactly equal output from both. The right sides of these two windings connect respectively to the active inner conductor 19 and the active inner guard shield 21 of a first triax cable 25. The left sides of secondary windings 7 and 9 connect respectively to ground and to high frequency measuring group 15 via blocking capacitor 17. Because of the amplitude of the signals issuing from secondary windings 7 and 9 are equal and because inner guard shield 21 has a low capacitance to ground at its outward end, it can be assumed that the amplitude of the signal input to high frequency measuring group 15 is in direct proportion to the capacitance-to-ground of active inner conductor 19 at its outward end.

Active inner conductor 19 passes from high resistance meter 1 to the lo-side of DUT test station 27. The hi-side of DUT test station 27 passes on, through a signal line 29 to a high voltage power supply 31 which typically has a range of 0–500 volts. The ground shield 39 of first triax cable 25 also passes to power supply 31.

Figure 2:
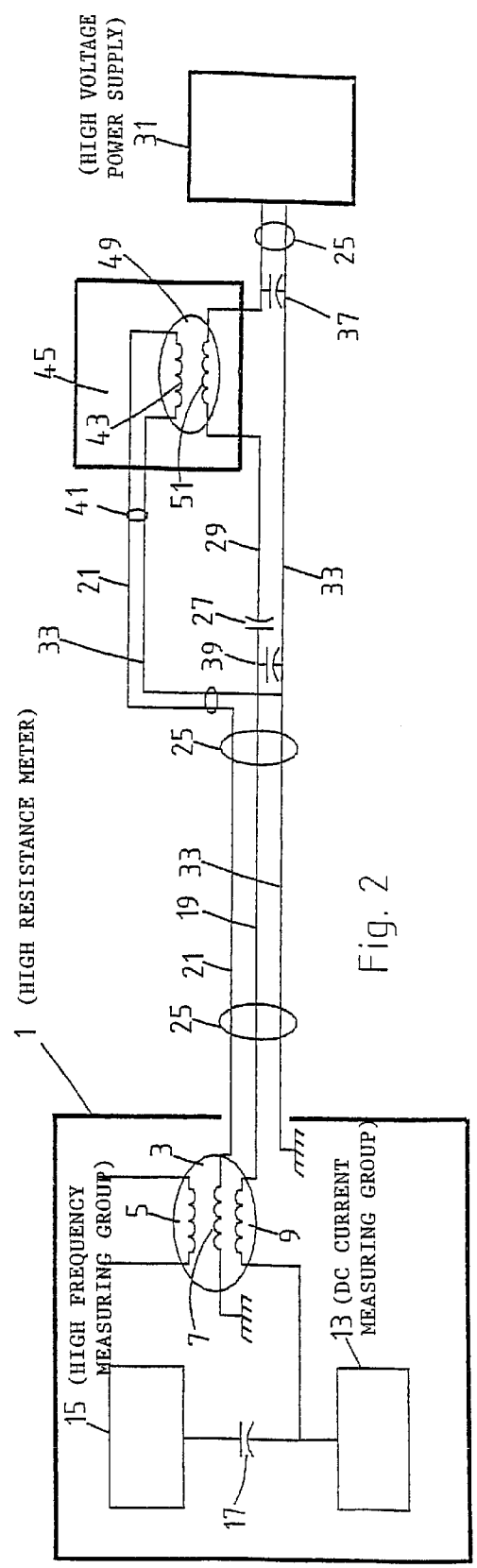

The right side of the DUT test station , i.e., signal line 29, has a comparatively low impedance to ground by virtue of the capacitance of the hi-side conductors, 29 and 33, and the intrinsic output impedance of power supply 31 and is represented in FIGS. 1 and 2 by capacitor 37. It can therefore be assumed that the capacitance to ground of active inner conductor 19 at its outward end nearly equates to the sum of the stray capacitance to ground of test station 27 (and is represented figuratively by capacitor 39) and the actual capacitance of the DUT.

During an initial compensation cycle of the HP-4349B, test station 27 is empty and the digitized output of high resistance meter 1 so obtained is stored in memory. During the later "parts present" test, this value is then subtracted from the digitized value obtained when a part is presumably placed in test station 27 to obtain an estimate of its presence and satisfactory contact in test station 27. One limitation of this method is that during the compensation cycle, if the value of stray capacitance 37 is high, such as 10 pF, compared to that of the DUT in test station 27, such as 1 pF, the former value masks the latter value and thereby renders stem insensitive to the presence of the DUT or chip when the value of the DUT is of a very low value.

During leakage testing, the programmed high voltage output from power supply 31 is applied to the right side of the DUT at test station 27 and the DC leakage current so developed passes through active inner conductor 19 of first triax cable 25 and secondary winding 9 to be applied to the input of DC measuring group 13.

This invention is shown in FIG. 2 as an additive to the external circuitry of the HP-4349B instrument. A second triax cable 41 is provided and is coupled to first triax cable 25 by a common T-adaptor (not shown) which provide active inner guard shield 21 to the input 43 (primary winding) to the booster device 45 shown here as a transformer. The secondary winding 51 of transformer 49 is connected between the output of high voltage power supply 31 and the hi-side of DUT station 27. Owing to the commonality of the high frequency generator within the HP-4349B, only one booster is required for all four channels of the HP-4349B and the four test sites that they service. No modification is required whatsoever to the internal circuitry of the HP-4349B.

Thus, when HP-4349B (meter 1) conducts its test protocol or "contact check", primary winding 43 of transformer 49 gets energized also by the 500 KHz voltage. Transformer 49 has a primary winding (43) to secondary winding (51) ratio of between about 1:2.5 to about 1:3, preferably the latter, and it is so phased that the secondary voltage coming from transformer 49 is inverse to that of first transformer 3. Secondary winding 51 is inserted in series with the source DC voltage from power supply 31 and is thus applied to the "high" side of the DUT at an amplitude that is at least three times what it would have been, had the high side of the DUT been connected only to a "virtual" ground as in the configuration shown in FIG. 1 without a DUT located in test station 27. Thus, secondary winding 51 of transformer 49 imposes a 500 KHz voltage in series with the chip at DUT test station 27 that is about three times the voltage imposed by secondary winding 9 of first transformer 3, and, since the two voltages are additive, the voltage imposed in series with the DUT is about four times greater than provided by the prior art circuit shown in FIG. 1. Thus, by use of this invention, the sensitivity of the high resistance meter, such as the HP-4349B, to the capacitive value of the DUT is increased by a factor of approximately four.

It is clear that booster device 45 could be an amplifier as well as a transformer as shown. It is to be considered that any combination of voltage, amperage, and signal booster is within the spirit of this invention.

While the invention has been described with reference to a particular embodiment thereof, those skilled in the art will be able to make various modifications to the described embodiment of the invention without departing from the true spirit and scope thereof. It is intended that all combinations of elements and steps which perform substantially the same function in substantially the same way to achieve substantially the same results are within the scope of this invention.

What is claimed is:

1. Apparatus for increasing the sensitivity of a testing device in a test program to test for the presence of an electronic part at the test station before beginning a test procedure, comprising:

a) a signal booster, having an input and an output, in operable arrangement with the testing device for boosting an incoming alternating signal from the testing device by a multiple greater than one;

b) connecting said input of said signal booster between the signal output of the testing device and the test station for positioning the electronic part for measuring; and, c) connecting said output of said signal booster between an independent direct current power supply and the test station to boost the signal of said test program by a multiple that brings the measurable capacitance of the electronic component within the range of sensitivity of said test meter.

2. The apparatus of claim 1 wherein said signal booster is a transformer.

3. The apparatus of claim 1 wherein said signal booster is an amplifier.

4. The apparatus of claim 1 wherein said signal booster is a transformer having a ration of first to second windings of about 1.25 to about 2.25.

5. Apparatus for increasing the sensitivity of a high resistance testing device in a test program to test for the presence of a multilayer ceramic chip capacitor at the test station before beginning a test procedure, comprising:

a) a signal booster, having an input and an output, in operable arrangement with the testing device for boosting an incoming alternating signal from the testing device by a multiple greater than one;

b) connecting said input of said signal booster between the signal output of the testing device and the test station for positioning the multilayer ceramic chip capacitor for measuring; and, c) connecting said output of said signal booster between an independent direct current power supply and the test station to boost the signal of said test program by a multiple that brings the measurable capacitance of the multilayer ceramic chip capacitor within the range of sensitivity of said test meter.

6. The apparatus of claim 5 wherein said signal booster is a transformer.

7. The apparatus of claim 5 wherein said signal booster is an amplifier.

8. The apparatus of claim 5 wherein said signal booster is a transformer having a ration of first to second windings of about 1.25 to about 2.25.

9. A method of improving the sensitivity of a testing device for measuring the current leakage of an electronic part wherein the testing device contains a protocol to test for the presence of the electronic part at the test station before the current leakage measurement is made, said method comprising the steps of:

a) capturing a portion of the test protocol signal and passing said signal through the input of a signal booster;

b) picking off the boosted signal from the output of the signal booster;

c) passing said boosted signal from the output of said signal booster back through the test station to the testing device to provide a measured signal of the electronic component at the station ready for measurement (DUT-present) or to provide no measured signal if the electric component is not at the station ready for measurement (no-DUT).

10. The method of claim 9 wherein the boosted signal is a multiple of at least three of the protocol test signal.

11. The method of claim 9 wherein the signal booster is a transformer and said step of passing said signal through the input of a signal booster comprises passing said signal through the primary windings of said transformer and said step of picking off the boosted signal from the output of said signal booster comprises the step of picking off the boosted signal from the secondary windings of said transformer.

12. The method of claim 9 wherein the signal booster is an amplifier having an input and an output and said step of passing said signal through the input of a signal booster comprises passing said signal through said input of said amplifier and said step of picking off the boosted signal from the output of said signal booster comprises the step of picking off the boosted signal from said output of said amplifier.

* * * * *

UNITED STATES PATENT AND TRADEMARK OFFICE
CERTIFICATE OF CORRECTION

PATENT NO. : 6,348,802 B1
DATED : February 19, 2002
INVENTOR(S) : Peter A. Cooke It is certified that error appears in the above-identified patent and that said Letters Patent is hereby corrected as shown below:

Column 4,
Line 7, replace "stem" with -- the system --
Line 18, replace "provide" with -- provides a signal over the --

Signed and Sealed this

Fifteenth Day of October, 2002

Attest:

JAMES E. ROGAN
Attesting Officer
Director of the United States Patent and Trademark Office